("12") United States Patent
Pan et al.

(10) Patent No.: US 11,394,490 B1
(45) Date of Patent: Jul. 19, 2022

(54) Q MARGIN

(71) Applicant: Acacia Communications, Inc., Maynard, MA (US)

(72) Inventors: Yue Pan, Boston, MA (US); Jonas Geyer, Somerville, MA (US)

(73) Assignee: Acacia Communications, Inc., Maynard, MA (US)

(*) Notice: Subject to any disclaimer, the term of this patent is extended or adjusted under 35 U.S.C. 154(b) by 0 days.

(21) Appl. No.: 16/722,300

(22) Filed: Dec. 20, 2019

(51) Int. Cl.
| | | |
|---|---|---|
| H04L 1/18 | (2006.01) | |
| H04L 1/00 | (2006.01) | |
| H03M 13/03 | (2006.01) | |
| H04L 1/06 | (2006.01) | |
| H03M 13/43 | (2006.01) | |

(52) U.S. Cl.
CPC .......... H04L 1/0057 (2013.01); H03M 13/03 (2013.01); H03M 13/43 (2013.01); H04L 1/0041 (2013.01); H04L 1/0045 (2013.01); H04L 1/0618 (2013.01)

(58) Field of Classification Search
None
See application file for complete search history.

(56) References Cited

U.S. PATENT DOCUMENTS

| | | | | |
|---|---|---|---|---|
| 2010/0178057 | A1* | 7/2010 | Shieh | H04L 27/2637 398/79 |
| 2016/0261344 | A1* | 9/2016 | Zhang | H04L 25/03885 |
| 2018/0269979 | A1* | 9/2018 | Zhang | H04B 10/5161 |
| 2019/0165926 | A1* | 5/2019 | Stojanovic | H04L 1/0045 |
| 2020/0136723 | A1* | 4/2020 | Bouda | H04L 1/0001 |
| 2020/0153533 | A1* | 5/2020 | Yilmaz | H04J 14/021 |

\* cited by examiner

Primary Examiner — Mujtaba M Chaudry
(74) Attorney, Agent, or Firm — Joseph D'Angelo

(57) ABSTRACT

A method, system, and ASIC chip for comparing a bit error rate (BER) to a forward error correction (FEC) threshold to determine a Q margin for a codeblock; wherein the BER corresponds to the number of errors in a given amount of data; where a codeblock of a FEC corresponds to the given amount of data; wherein the FEC threshold corresponds to the maximum amount of errors per codeblock that the FEC is able to remove per given amount of data; wherein the Q margin corresponds to a difference between the BER and the FEC threshold.

16 Claims, 5 Drawing Sheets

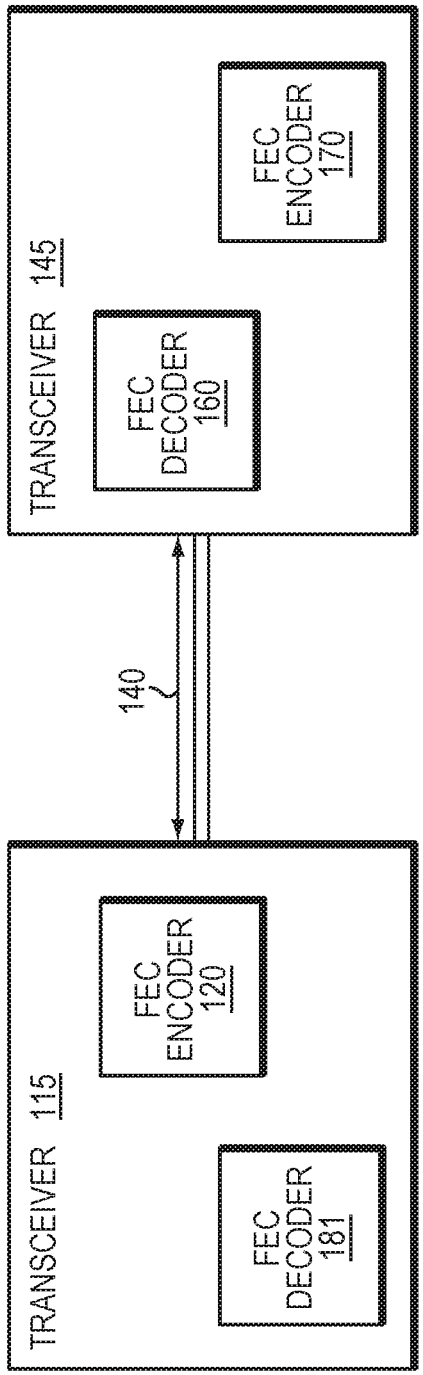

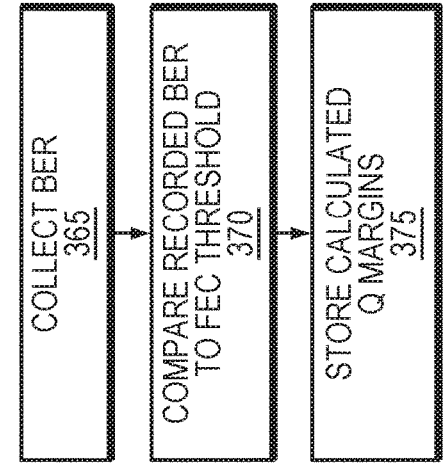
FIG. 3A
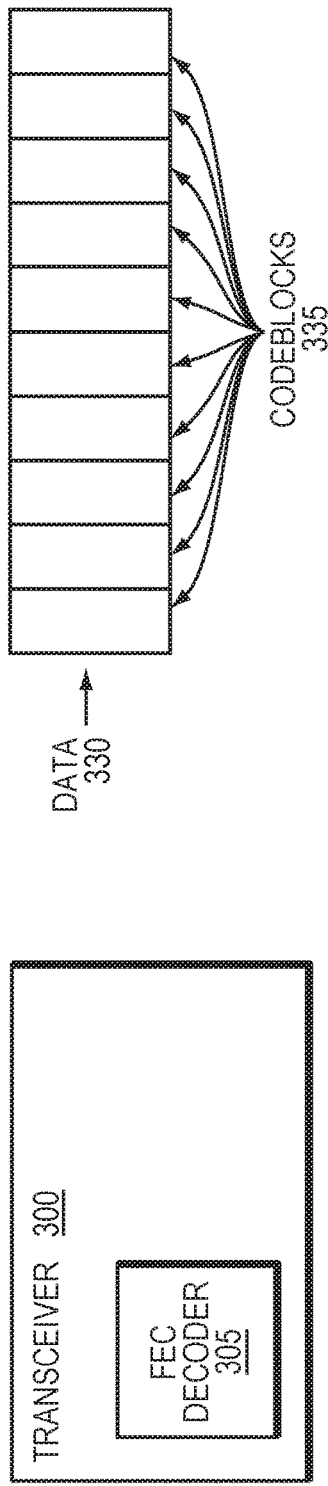
FIG. 3D
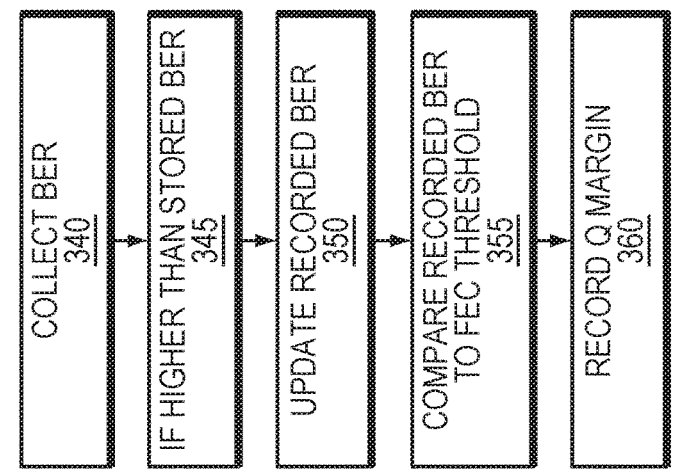
FIG. 3E
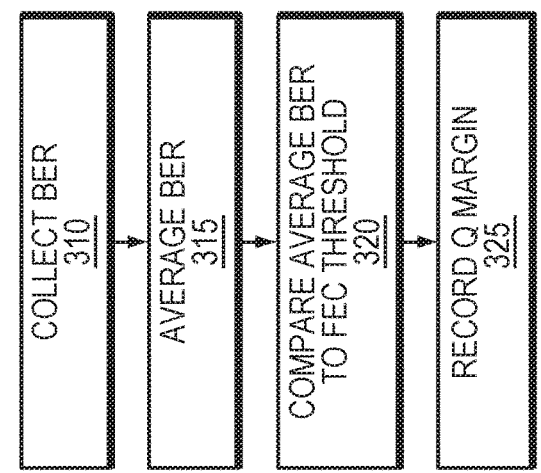
FIG. 3C
FIG. 3B

Q MARGIN

BACKGROUND

In communication systems, it may be undesirable to transmit errors in the data desired to be communicated.

SUMMARY

A method, system, and ASIC chip for comparing a bit error rate (BER) to a forward error correction (FEC) threshold to determine a Q margin for a codeblock; wherein the BER corresponds to the number of errors in a given amount of data; where a codeblock of a FEC corresponds to the given amount of data; wherein the FEC threshold corresponds to the maximum amount of errors per codeblock that the FEC is able to remove per given amount of data; wherein the Q margin corresponds to a difference between the BER and the FEC threshold.

BRIEF DESCRIPTION OF DRAWINGS

Various aspects and embodiments of the application will be described with reference to the following example embodiments. It should be appreciated that the figures are not necessarily drawn to scale.

FIGS. 1a, 1b, and 1c are simplified illustrations of an apparatus, method for encoding and sending data, and a method for decoding data, in accordance with embodiments of the present disclosure;

FIG. 3a illustrates a simplified illustration of a transceiver with a decoder, in accordance with embodiments of the present disclosure;

FIGS. 3b, 3c, and 3e illustrate simplified alternative methods of calculating a Q margin, in accordance with embodiments of the present disclosure;

FIG. 3d is a simplified illustration of codeblocks, in accordance with embodiments of the present disclosure;

DETAILED DESCRIPTION

Figure 2A:
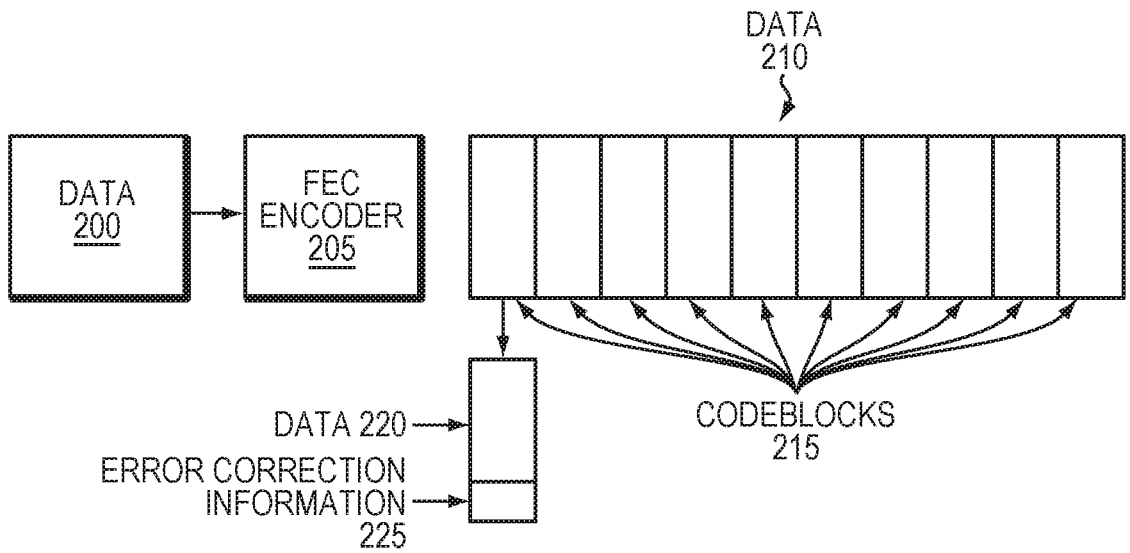
FIGS. 2a and 2b illustrate simplified embodiments of FEC encoding, in accordance with embodiments of the present disclosure.

In many embodiments, a communication or transmission system may include a transmitter and a receiver. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

Typically, wireless transport systems allow levels of errors or Bit Error Ratio (BER) on the order of $10^{-6}$. Generally, wireless transport systems do not use all the margin or bandwidth in their systems. Usually, wireless transport systems may also have the ability to retransmit data with errors at a low cost. Conventionally, wireless transport systems may be able to accommodate higher levels of errors than optical transport systems.

Conventionally, optical transport systems have required a low level of errors or BER, usually less than $10^{-15}$. Generally, optical transport systems have also tended to use all or almost all of the margin or bandwidth available in an optical link. Typically, retransmission of optical data, such as in the case when an error rate is too high, is costly due to the time necessary to request and receive a retransmission, especially in ultra long haul systems. Usually, retransmission over an undersea link has a high time cost for a transmission across the link requesting the retransmission and the time cost of the retransmission across the link, where the length of the link can span an ocean.

In many embodiments, a forward error correction (FEC) may be used in an optical transmission systems to help eliminate errors. In many embodiments, forward error correction may involve encoding data for transmission over a communication channel by adding redundancy to the data. In certain embodiments, a forward error correction technique may involve: (1) receiving data bits for transmission over a communication channel; (2) encoding the data bits by using an error correcting code (ECC) to generate parity bits from the data bits; and (3) transmitting both the data bits and the parity bits over the communication channel. In many embodiments, parity bits may be generated from the data bits. Transmission of the data bits and parity bits together provides a degree of redundancy in the transmitted information, which in turn may allow for recovery from errors that may occur during transmission. In certain embodiments, a FEC may also include an interleaver and deinterleaver. In some embodiments, an interleaver may take data of a given time period and redistribute the data over different time periods. In many embodiments, a deinterleaver may redistribute data distributed over different time periods by an interleaver back to the original time periods of the data.

In almost all embodiments, it may be helpful to determine whether a FEC is successfully able to remove enough errors to reach a certain level of reliability. In many embodiments, the level of errors a FEC may be able to remove from transmitted data may be called a FEC threshold. In most embodiments, a comparison between a BER and a FEC threshold may be referred to as a Q-factor margin or quality factor margin, or short Q margin. In almost all embodiments, a Q margin may be a measure of how far a FEC is from breaking or not being able to successfully remove errors from the system.

In many embodiments, BER may be a function of a signal to noise ratio or optical signal to noise ratio in an optical system. In some embodiments, a signal to noise ratio may refer to how much noise or optical noise is in a signal compared to the signal's power or optical power. In particular embodiments, if the signal to noise ratio is X, where X represents the amount of noise to signal strength, then X may be converted to a BER of Y. In most embodiments, BER may be converted to a Q-factor, from which the Q-factor margin can be calculated by comparing it to the BER at the FEC threshold.

In certain embodiments, Applicants have realized that conventional techniques may have considered a BER that results from noise to be similar to Gaussian noise with time-invariant variance. In most embodiments, BERs for an optical signal were averaged and compared to a threshold to determine a Q margin. In many embodiments, as BER was assumed to be caused by Gaussian, time-invariant noise, averaging BER should represent a correct measurement of BER over time. In almost all embodiments, Applicants have realized that averaging BER rates over a given period of time may result in missing when a BER rate exceeds a FEC threshold resulting in an incorrect calculation of and reporting of a Q margin or quality margin.

In a particular example embodiment, Applicants have realized that if errors of multiple FEC code blocks were averaged to calculate the BER and only one of those blocks has a high error rate, then the average BER rates would reflect a much lower number than the single high BER. In this particular embodiment, the single high BER might exceed a FEC threshold and indicate an unacceptable amount of errors, but this would be hidden by the average BER. In this particular embodiment, if the average BER were then used to calculate a Q margin, then the Q margin would not correctly represent how close a FEC was to reaching the FEC threshold because the Q margin would indicate it has not passed the threshold, although a failure occurred due to the single high BER.

In almost all embodiments, data provided to a FEC may be divided up into FEC codeblocks. In certain embodiments, a FEC codeblock may refer to a certain set of data bits provided to a FEC in a given time interval encoded and packaged with error correcting information. In some embodiments, a FEC may have a FEC threshold, which may refer to how many errors may be corrected in a given FEC codeblock with the error correction information. In many embodiments, if the errors in any FEC codeblock exceed the FEC threshold, then a FEC may not be able to successfully remove enough errors to meet the required level of errors for the system.

In almost all embodiments, Applicants have realized that BERs are not distributed according to time-invariant Gaussian noise and that using an average BER over longer time can lead to incorrect calculation of a Q margin and may not identify all unacceptable BERs. In many embodiments, Applicants have realized that a single BER in a single FEC codeblock exceeding a FEC threshold may need to be reported. In almost all embodiments, Applicants have realized that this was typically not done as BER was assumed to be time-invariant Gaussian and average BER over a given period of time was used in a comparison to BER threshold to calculate Q margin. In almost all embodiments, Applicants have realized that a time period for a BER or average of BER may need to be the same time period corresponding to the number of bits in a FEC codeblock.

In most embodiments, BER rates may be recorded at a time frequency that corresponds to the amount of data in a FEC codeblock. In some embodiments, each recorded BER for a period of time corresponding to a FEC codeblock may be compared to a FEC threshold to determine a Q margin. In other embodiments, the maximum BER for a set of BER, each BER corresponding to a time interval equivalent to a FEC codeblock, may be recoded. In some embodiments, a recorded maximum BER may periodically be compared to a FEC threshold to calculate Q margin. In almost all embodiments, capturing a BER for each FEC codeblock may enable determination if any FEC codeblock had an unacceptable amount of error.

Refer now to the example embodiments of FIGS. 1a, 1b, and 1c, which illustrate an apparatus, method for encoding and sending data, and a method for decoding data. In these example embodiments, Transceiver 115 has FEC encoder 120, which encodes data (step 182). Transceiver 115 sends data (step 186) to transceiver 145 through link 140. Transceiver 145 receives data (step 190). FEC decoder 160 decodes data (step 192).

Figure 2B:
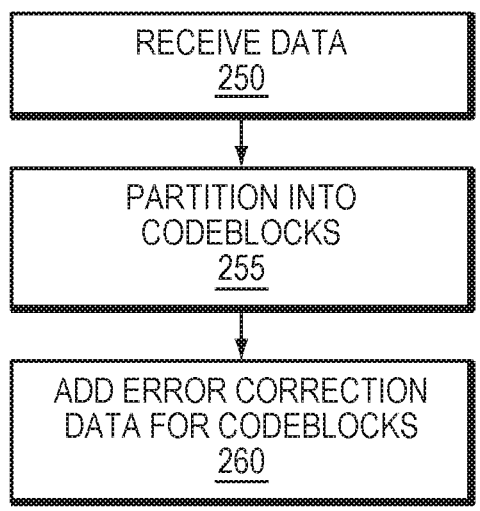

Refer now to the example embodiment of FIGS. 2a and 2b, which illustrate simplified embodiments of FEC encoding. Data 200 is received at FEC encoder 205 (step 250). FEC encoder 205 partitions data into codeblocks 215 (step 255). FEC encoder 205 adds error correction data (step 260) for codeblocks 215, as illustrated by data 220 and error correction information 225.

Refer now to the example embodiment of FIGS. 3a and 3b, which illustrate simplified embodiments of calculating a Q margin. Transceiver 300 has FEC decoder 305, which collects BER for received data (step 310). Transceiver 300 averages the collected BER over a given period of time (Step 315). Transceiver 300 compares the averaged BERs to a FEC threshold (step 320). Transceiver 300 records a Q margin (step 325).

Refer now to the example embodiments of FIGS. 3a, 3c, and 3d, which illustrate alternative simplified embodiments of calculating a Q margin. Transceiver 300 collects BER for each code block 335 of data 330 (step 340). For each BER, transceiver 300 makes a determination if the BER is higher than the stored BER (step 345). If the BER is higher, a recorded BER is updated (step 350). After all of the BER are compared, the highest BER, which is recorded, is compared to a FEC threshold (step 355). Transceiver 300 records a Q margin (step 360).

Refer now to the example embodiments of FIGS. 3a, 3d, and 3e, which illustrate alternative simplified embodiments of calculating a Q margin. Transceiver 300 collects BER for each code block 335 of data 330 (step 365). For each BER, Transceiver 300 compares the BER to the FEC threshold (step 370). For each comparison, Transceiver 300 stores a Q margin (step 375).

Figure 4:
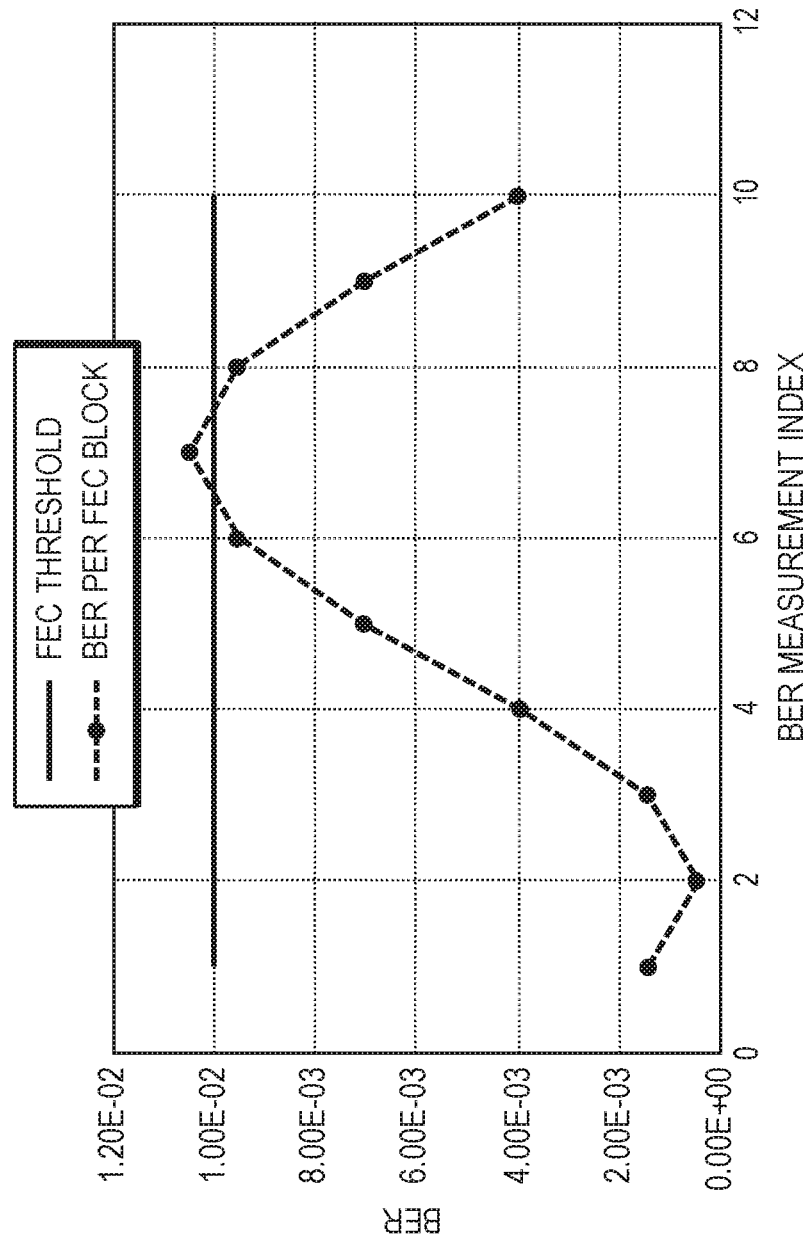
FIG. 4 illustrates a graph of BER measurements, in accordance with embodiments of the present disclosure.

Refer now to the example embodiment of FIG. 4, which illustrates a graph of BER measurements. In the graph of FIG. 4, there are 10 values for BER at 10 codeblocks and a line at 1.00E-2 indicating a FEC threshold. In the graph of FIG. 4, there is one value for codeblock 7, which is over the FEC threshold.

Figure 5A:
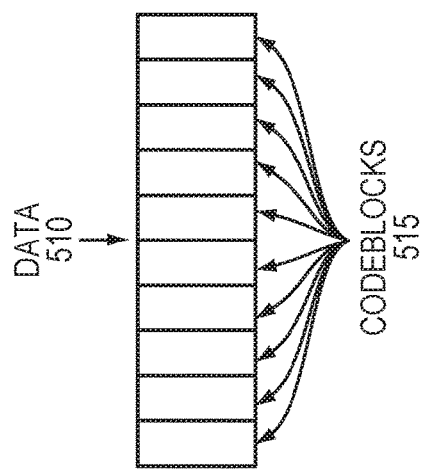
FIGS. 5a, 5b, and 5c are simplified illustrations of application of the methods of FIGS. 3a, 3b, and 3c, using the data from the graph of FIG. 4, in accordance with embodiments of the present disclosure.
Figure 5B:
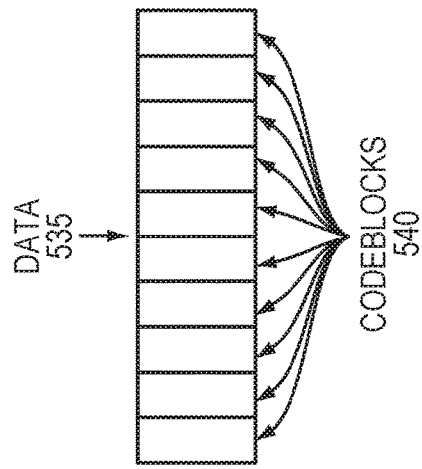
Figure 5C:
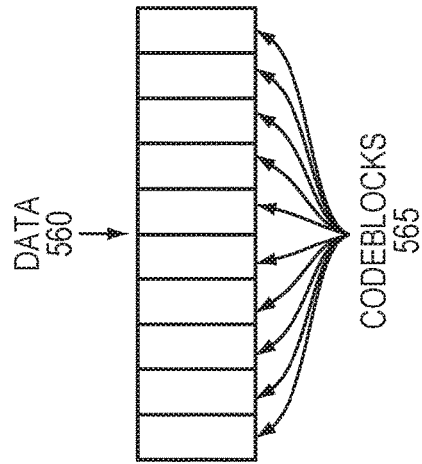

Refer now to the example embodiments of FIGS. 5a, 5b, and 5c, which illustrate examples of the results of FIGS. 3a, 3b, and 3c, when implemented against the values of the graph of FIG. 4. In FIG. 5a, the values for each codeblock 515 are averaged, resulting in a mean BER of 5.50E-3 and a mean Q of 8.11. In this example embodiment, the FEC threshold in BER is 1.00E-2 and the FEC threshold in Q_db is 7.33. As a result of the averaging, there is an expected Qdb margin from mean of 0.77 while the actual margin exceeds the Q value by −0.07, indicating a failure of a codeblock. In the example embodiment of 5a, this error goes unregistered.

Refer now to the example embodiment of FIG. 5b, a maximum value of a code error is kept. In the example embodiment of 5b, there is a mean BER of 5.5E-3 and a mean Q of 8.11. In this embodiment, for all of the 10 codeblocks 540, a FEC MIN Q of 7.26 is recorded, which has a FEX MAX value of 1.05E-2 and a resulting actual Q margin of −0.07. In this example embodiment, the FEC threshold in BER of 1.00E-2 is exceeded by the actual MAX recoded value of 1.05E-2 and the FEC threshold in Q_db of 7.33 above the recorded value of 7.26. In the example embodiment of FIG. 5b, the error is recorded.

Refer now to the example embodiment of FIG. 5c, which illustrates tracking and recording of a BER for each codeblock 565. In the example embodiment of FIG. 5c, a BER for BER 1 to BER 10 is captured and recoded. In this example embodiment, BER 7 is noted to have a FEC MIN value of 1.05E-2, which is above the FEC threshold in BER of 1.00E-2. As well, the measured Q value is 7.26, which is below the FEC threshold in Q of 7.33, resulting in a Q margin of −0.07. In this example embodiment, the error is noted and recorded and specific information related to which codeblock caused the error is available.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor. In most embodiments, a processor may be a physical or virtual processor. In other embodiments, a virtual processor may be spread across one or more portions of one or more physical processors.

In certain embodiments, one or more of the embodiments described herein may be embodied in hardware such as a Digital Signal Processor DSP. In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In some embodiments, on or more of an encoder, decoder, mapper, modulator, demodulator, decoder, and demapper may be part of one or more DSPs. In other embodiments, one or more of the embodiments stored on a computer readable medium may be loaded into a processor and executed. In further embodiments, on or more of the techniques herein may be performed by an ASIC chip. In certain embodiments, a DSP may be an ASIC chip. In certain embodiments, one or more of the embodiments described herein may be implemented by an ARM processor. In some embodiments, one or more of the embodiments described herein may be implemented in an ASIC.

What is claimed is:

1. A method comprising:
   receiving at least one of a plurality of forward error correcting (FEC) codeblocks transmitted across an optical link; wherein each of the plurality of FEC codeblocks correspond to a portion of data bits provided to the FEC in a given time interval;
   measuring a bit error rate (BER) for each of the plurality of FEC codeblocks;
   determining a Q margin by comparing the measured BER for each of the plurality of FEC codeblocks with a FEC threshold; wherein the FEC threshold corresponds to the maximum amount of errors per FEC codeblock that the FEC is able to correct;
   storing the Q margin for each of the plurality of FEC codeblocks; and
   reporting each of the plurality of FEC codeblocks and an associated measured BER when the Q margin exceeds the FEC threshold for any of the plurality of FEC codeblocks; wherein if the Q margin for any one of the plurality of FEC codeblocks exceeds the FEC threshold each of the plurality of FEC codeblocks is discarded.

2. The method of claim 1 further comprising:
   determining a maximum measured BER; wherein a plurality of BERs are measured for a set of the plurality of FEC codeblocks; wherein the maximum BER is the largest of the plurality of measured BER for the set of the plurality of FEC codeblocks;
   determining a max BER Q margin;
   storing the max BER Q margin; and
   reporting the max BER Q margin to enable determination on whether an FEC codeblock had an unacceptable amount of error.

3. The method of claim 1 wherein the amount of data is data converted from an optical signal.

4. The method of claim 3 wherein the FEC threshold further corresponds to the amount of errors that may be removed; where the errors include errors introduced during transmission of the optical signal.

5. The method of claim 4 wherein the FEC includes a decoder on a receiver portion of a second transceiver; and the decoder decodes a signal encoded by an encoder of the FEC on a transmitter portion of a first transceiver.

6. The method of claim 4 wherein the optical signal is transmitted from the transmitter portion of a first transceiver to the receiver portion of the second transceiver.

7. An ASIC chip comprising
   Forward Error Correction; and
   logic enabling:
      receiving at least one of a plurality of FEC codeblocks transmitted across an optical link; wherein each of the plurality of FEC codeblocks correspond to a portion of data bits provided to the FEC in a given time interval;
      measuring a bit error rate (BER) for each of a plurality of FED codeblocks;
      determining a Q margin by comparing the measured BER for each of the plurality of FEC codeblocks with an FEC threshold; wherein the FEC threshold corresponds to the maximum amount of errors per FEC codeblock that the FEC is able to correct;
   storing the Q margin for each of the plurality of FEC codeblocks; and
   reporting each of the plurality of FEC codeblocks and an associated measured BER when the Q margin exceeds the FEC threshold; wherein if the Q margin for any one of the plurality of FEC codeblocks exceeds the FEC threshold each of the plurality of FEC codeblocks is discarded.

8. The ASIC chip of claim 7, wherein the logic further enables:
   determining a maximum measured BER; wherein a plurality of BERs are measured for a set of the plurality of FEC codeblocks; wherein the maximum BER is the largest of the plurality of measured BER for the set of the plurality of FEC codeblocks;
   determining a max BER Q margin;
   storing the max BER Q margin; and
   reporting the max BER Q margin to enable determination on whether an FEC codeblock had an unacceptable amount of error.

9. The ASIC chip of claim 7, wherein the amount of data is data converted from an optical signal.

10. The ASIC chip of claim 9, wherein the FEC threshold further corresponds to the amount of errors that may be removed; where the errors include errors introduced during transmission of the optical signal.

11. The ASIC chip of claim 10, wherein the FEC includes a decoder on a receiver portion of a second transceiver; wherein the logic further enables the decoder decodes a signal encoded by an encoder of a transmitter FEC on a transmitter portion of a first transceiver.

12. The ASIC chip of claim 11 wherein the optical signal is transmitted from the transmitter portion of a first transceiver to the receiver portion of the second transceiver.

13. A system comprising:

a first transceiver with an ASIC; wherein the first transceiver ASIC has a first FEC;

and a second transceiver with an ASIC; wherein the second transceiver ASIC has a second FEC; and logic enabling:

transmission of at least one of a plurality of FEC codeblocks across an optical link; wherein each of the plurality of FEC codeblocks correspond to a portion of data bits provided to the FEC in a given time interval;

measuring a bit error rate (BER) for each of the plurality of FEC codeblocks;

determining a Q margin by comparing the measured BER for each of the plurality of FEC codeblocks with an FEC threshold; wherein the FEC threshold corresponds to the maximum amount of errors per FEC codeblock that the FEC is able to correct;

storing the Q margin for each of the plurality of FEC codeblocks; and reporting each of the plurality of FEC codeblocks and an associated measured BER when the Q margin exceeds the FEC threshold; wherein if the Q margin for any one of the plurality of FEC codeblocks exceeds the FEC threshold each of the plurality of FEC codeblocks is discarded.

14. The system of claim 13, wherein the logic further enables:

determining a maximum measured BER; wherein a plurality of BERs are measured for a set of the plurality of FEC codeblocks; wherein the maximum BER is the largest of the plurality of measured BER for the set of the plurality of FEC codeblocks;

determining a max BER Q margin;

storing the max BER Q margin; and reporting the max BER Q margin to enable determination on whether an FEC codeblock had an unacceptable amount of error.

15. The system of claim 14, wherein the amount of data is data converted from an optical signal.

16. The system of claim 15 wherein the optical signal is transmitted from the first transceiver to the second transceiver.

\* \* \* \* \*